(12) United States Patent
Chang

(10) Patent No.: US 6,756,703 B2
(45) Date of Patent: Jun. 29, 2004

(54) TRIGGER SWITCH MODULE

(76) Inventor: Chi Che Chang, No. 3, Lane 69, Hejiang St., Taipei (TW)

(*) Notice: Subject to any disclaimer, the term of this patent is extended or adjusted under 35 U.S.C. 154(b) by 323 days.

(21) Appl. No.: 10/083,364

(22) Filed: Feb. 27, 2002

(65) Prior Publication Data

US 2003/0160518 A1 Aug. 28, 2003

(51) Int. Cl.⁷ .............................................. H01H 35/00
(52) U.S. Cl. ........................ 307/147; 307/119; 200/600; 361/278
(58) Field of Search ................................ 307/119, 147; 200/600; 361/278, 280, 283.1; 324/658, 686, 661

(56) References Cited

U.S. PATENT DOCUMENTS

| | | | | |
|---|---|---|---|---|
| 3,710,209 A | * | 1/1973 | Webb et al. ................. 200/600 |
| 4,290,052 A | * | 9/1981 | Eichelberger et al. ....... 361/280 |
| 4,293,745 A | * | 10/1981 | Matsuda et al. ............. 200/600 |
| RE30,923 E | * | 5/1982 | Durkee et al. ............... 200/516 |
| 4,330,284 A | * | 5/1982 | Dotsko et al. ............... 324/661 |
| 4,380,007 A | * | 4/1983 | Steinegger .................... 341/33 |
| 4,380,040 A | * | 4/1983 | Posset .......................... 200/600 |
| 4,417,294 A | * | 11/1983 | Herron, Jr. ................... 361/288 |
| 4,584,444 A | * | 4/1986 | Nagashima ................. 200/600 |
| 4,963,829 A | * | 10/1990 | Wereb ......................... 324/686 |
| 5,008,497 A | * | 4/1991 | Asher ...................... 178/18.05 |
| 5,140,273 A | * | 8/1992 | Takahashi .................... 324/661 |
| 5,166,482 A | * | 11/1992 | Li ................................. 200/600 |
| 5,235,217 A | * | 8/1993 | Kirton ......................... 307/116 |
| 5,457,289 A | * | 10/1995 | Huang et al. ............. 178/18.08 |
| 5,535,626 A | * | 7/1996 | Bullis et al. ................. 361/280 |
| 5,684,677 A | * | 11/1997 | Uchida et al. ............... 361/770 |
| 5,716,129 A | * | 2/1998 | Kunen et al. ................ 307/116 |
| 5,917,165 A | * | 6/1999 | Platt et al. ................... 200/600 |
| 6,248,655 B1 | * | 6/2001 | Machida et al. ............ 438/597 |
| 6,265,682 B1 | * | 7/2001 | Lee .............................. 200/600 |
| 6,269,693 B1 | * | 8/2001 | Irion ............................ 324/665 |
| 6,288,885 B1 | * | 9/2001 | Jiang et al. .................. 361/111 |
| 6,373,265 B1 | * | 4/2002 | Morimoto et al. .......... 324/686 |
| 6,403,904 B1 | * | 6/2002 | Schilling ..................... 200/600 |
| 6,465,746 B1 | * | 10/2002 | Kajita .......................... 361/808 |
| 6,478,565 B2 | * | 11/2002 | Woodmansee et al. ..... 425/149 |
| 6,508,137 B2 | * | 1/2003 | Suzuki .................. 73/862.043 |
| 6,608,617 B2 | * | 8/2003 | Hoffknecht et al. ......... 345/173 |
| 6,642,857 B1 | * | 11/2003 | Schediwy et al. ............ 341/20 |
| 6,661,239 B1 | * | 12/2003 | Ozick .......................... 324/658 |
| 6,667,563 B2 | * | 12/2003 | Bae et al. .................... 200/600 |
| 2003/0169057 A1 | * | 9/2003 | Ishiguro et al. ............. 324/661 |

* cited by examiner

Primary Examiner—Brian Sircus
Assistant Examiner—Roberto J Rios
(74) Attorney, Agent, or Firm—Bacon & Thomas, PLLC

(57) ABSTRACT

A trigger switch module suitable for use with various household appliances and instruments is capable of generating a signal needed by a microcontroller via a human-machine interface, so that the trigger switch module has stable signal level output pins for a microprocessor or a logic gate to make judgment easily. The trigger switch module can be triggered to output a signal through a non-direct contact of the switch at low voltage and low power consumption. All components of the trigger switch module are enclosed in a top casing that is completely watertight and dustproof to ensure stable capacity of the switch. The trigger switch module combines the functions of conventional switches but eliminates drawbacks thereof. A touch panel made of plastics, metal, glass, ceramic or other insulating material may be provided with the top casing to ensure safe and durable use of the trigger switch module.

4 Claims, 3 Drawing Sheets

TRIGGER SWITCH MODULE

BACKGROUND OF THE INVENTION

1. Field of the Invention

The present invention relates to a trigger switch module, and more particularly to a trigger switch module that can be used with various kinds of household appliances, lighting fixtures, instruments, etc. to generate a signal needed by a microcontroller via a human-machine interface, so that programs and circuit designs for peripheral hardware can be done more conveniently, and the electronic trigger switch can operate through a non-direct contact with the switch. With the trigger switch module, conventional switches and related products are upgraded to the rank of microcomputer-type touch-controlled products that have increased added value.

2. Description of the Prior Art

A conventional mechanical-type switch is subject to fatigue phenomenon and even fatigue failure due to frequent mechanical movements during its service over a long time. On the other hand, technical skills related to applied electronic products are constantly developed and innovated in recent years, resulting in the presentation of a variety of trigger switches that have been widely and frequently used to gradually replace the mechanical-type switches. The up-to-date electronic trigger switches have become very popular and eliminate drawbacks existing in the convention mechanical-type switches. One of the most welcomed electronic trigger switches is a touch switch that is widely employed on indoor lighting fixture and general household appliances. Most currently available touch switches are triggered through contacting a conducting body by a user, and static charge is grounded via the user's body. That is, most touch switches operate according to a change in static field energy or a direct trigger of an internal control circuit thereof, or utilize a user's body resistance to perform electrical connection or impedance detection between two conducting bodies. The above-mentioned triggering of touch switch is achieved through direct contact of the user's finger with a metal member of the touch switch. In the event the touch switch does not include a control circuit to provide good safety measures, a user might very possibly be injured due to many external factors, such as leakage, shock, etc., at the moment of contacting the touch switch. That is, the currently available touch switches do not provide necessary safety means and therefore adversely affect the user's safety in using products having touch switches.

It is therefore desirable to improve the safety design for trigger switches to eliminate drawbacks existing in the currently available touch switches.

SUMMARY OF THE INVENTION

A primary object of the present invention is to provide a trigger switch module in which a signal needed by a microcontroller is generated via a human-machine interface, and stable signal level output pins are included, so that a microprocessor or a logic gate can make judgment easily. The electronic trigger switch signal is triggered through a non-direct contact of the switch to send out signal. The trigger switch module of the present invention has low power consumption, wide service voltage, and fewer external components to provide designers with high flexibility in using the switch. The trigger switch module of the present invention combines the functions of conventional slide switches and button switches but eliminates drawbacks existing in these conventional switches.

Another object of the present invention is to provide a modularized trigger switch, so that the entire trigger switch is provided in an enclosed space, in which humidity or other media that might affect or change capacity of the switch are not influenced by air convection outside the enclosed space to cause unstable capacity. In brief, circuit elements and other components and parts of a non-modularized trigger switch are exposed to external environment. Flows of ambient air would result in increased or decreased humidity that is a factor adversely affecting the stable capacity of the trigger switch. By way of modularization, the trigger switch has a highly stable capacity, which is equal to body capacity, to perform the on/off function.

A further object of the present invention is to provide a trigger switch module that has an operating mode of utilizing signals needed by a microcontroller and can therefore include a touch panel that is not limited to plastics, metals, but can include a wide range of other materials, such as glass, ceramic, wood, stone, etc., so that the touch panel may have a variety of designs for use with various household appliances and code-controlled devices and switches.

A still further object of the present invention is to provide a trigger switch module that can be triggered through non-direct contact of the switch, so that a product with such trigger switch module is upgraded to the rank of microcomputer-type touch-controlled products. All the components of the trigger switch module are enclosed in a non-metal casing and fully protected against water and dust, so that the trigger switch module has increased added value and a widened range of application.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
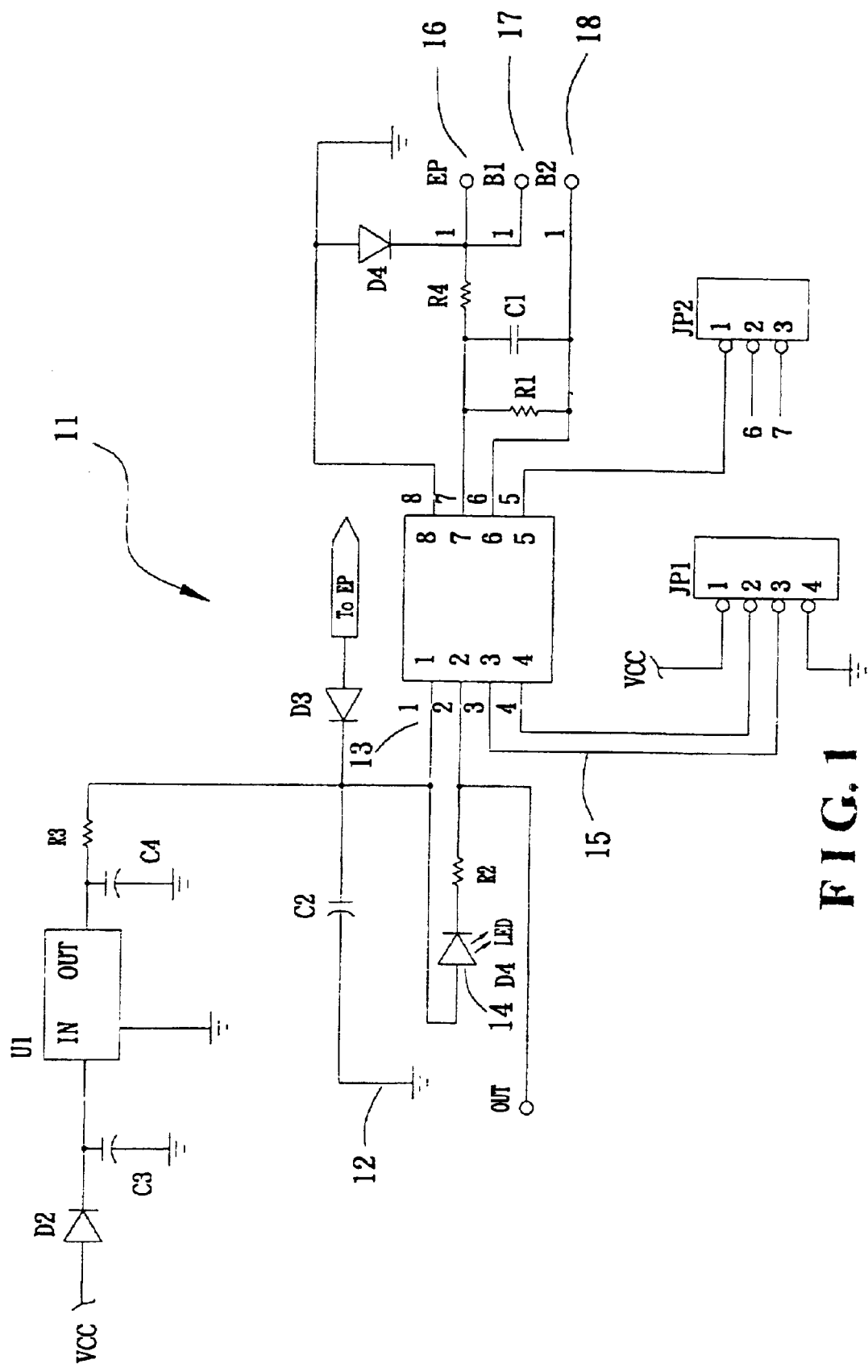
FIG. 1 is a circuit diagram of the present invention.

Please refer to FIG. 1 that is a circuit diagram of a trigger switch module according to the present invention. As shown, the present invention includes a circuit board 10 on which there is provided a control circuit 11, a grounding end 12 via which the trigger switch module is grounded, a power input 13 via which power is supplied to the trigger switch module, a light-emitting diode (LED) 14 serving as a touch indicating lamp, a signal output 15 via which a signal is sent out, a contact end 16 at where a user touches to trigger the switch, and sensors 17, 18 for sensing a touch of user at the touch end 16 and causing the signal end 15 to output a signal. The sensors 17, 18 may have sensibility adjustable according to a user's requirement.

Figure 2:
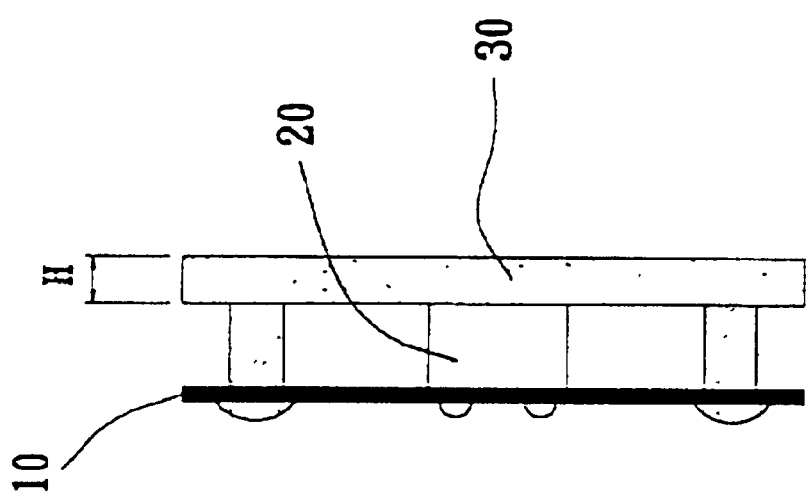
FIG. 2 is a schematic plan view of a preferred embodiment of the present invention.

Please refer to FIG. 2 that is a schematic plan view of a trigger switch module according to a preferred embodiment of the present invention. As shown, the trigger switch module mainly includes a switch element 20, an end of which is inserted onto the above-mentioned circuit board 10, and another end of which is covered with a touch panel 30. For the switch to be durable and safe for use, the touch panel 30 is made of an insulating material and has a thickness H adjustably designed in accordance with users' individual requirements. The materials for the touch panel 30 are not limited to conventional plastics or metals. Any other material that can be easily fabricated and machined, such as glass, ceramic, wood, stone, and the like, can also be employed to make the touch panel 30, so long as the material is able to prevent occurrence of direct electric shock and reduce the influence of electric current on human body. In this manner, a variety of touch panels may be provided for the trigger switch module of the present invention.

Figure 3:
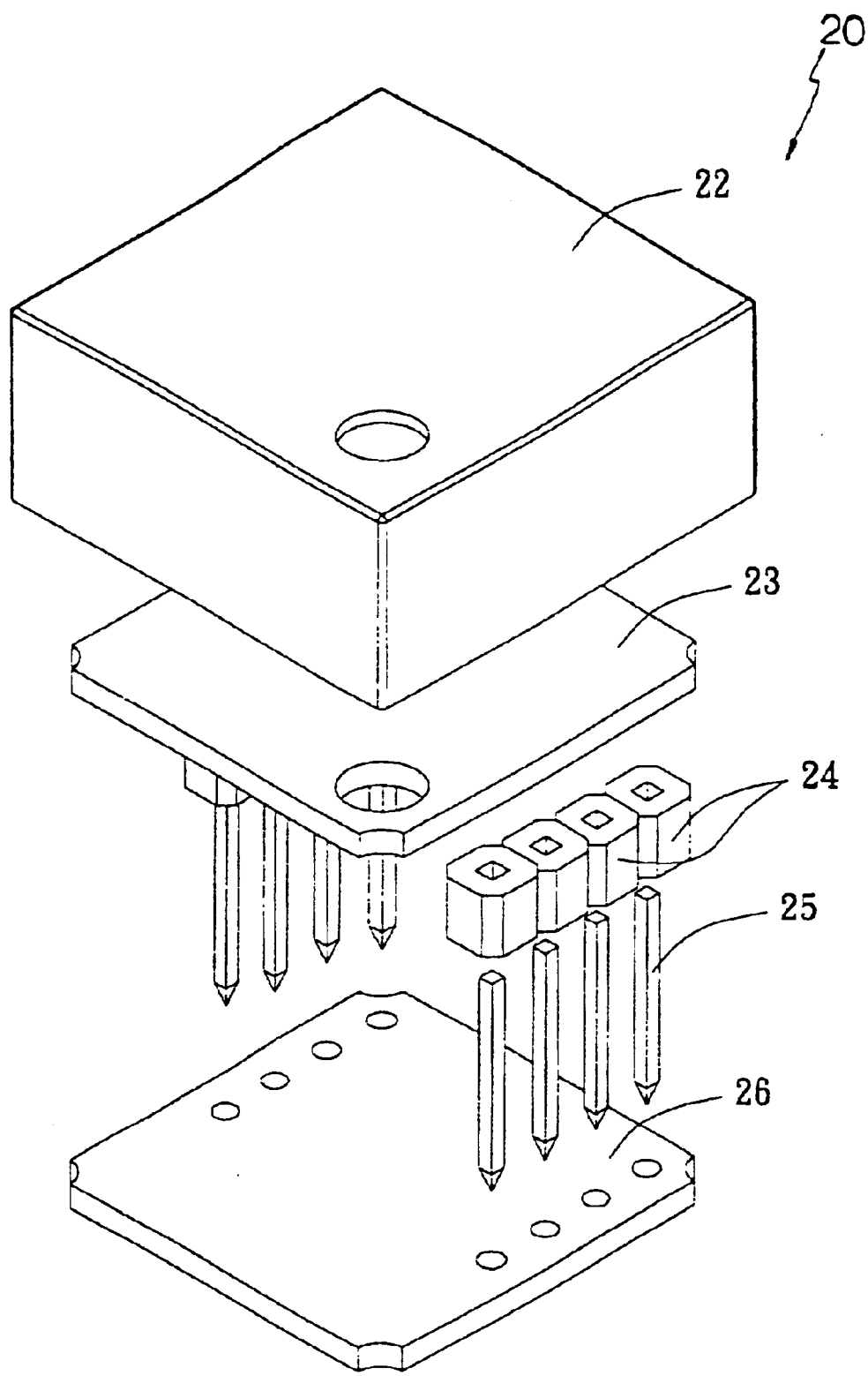
FIG. 3 is an exploded perspective view of a switch element of the present invention.

FIG. 3 is an exploded perspective view of the switch element 20. As shown, the switch element 20 includes a top casing 22, a sensing board 23 located below the top casing 22, a connecting element 24 located below the sensing board 23, and a plurality of pins 25 having a first end inserted into the connecting element 24 and a second end inserted onto a circuit board 26. A distance between the sensing board 23 and the circuit board 26 is set according to body capacity. When the switch element 20 is fully assembled into one unit, a user needs only to lightly push the switch element 20 or the touch panel 30 for the sensing board 23 to sense the body capacity and trigger the switch.

While a proper distance between the sensing board 23 and the circuit board 26 via the connecting element 24 enabling setting of body capacity for the trigger switch module, air convection would cause unstable humidity and deviation of capacity to fail the switch. To protect the trigger switch from failure caused by such factors, the sensing board 23, the connecting element 24, the pins 25, and the circuit board 26 all are assembled and enclosed in the top casing 22 to form a module, so that a stable capacity could be obtained in the enclosed top casing 22.

The switch element 20 may have shape, dimensions, distance of sensing, and panel switch module all designed in accordance with users' individual requirements.

To trigger the switch, a user needs only to contact the touch panel 30. At this point, a body capacity effect would cause the sensors 17, 18 on the circuit board 10 to sense changes in the position of the touch panel 30 and accordingly the switch element 20 due to the contact. A feedback circuit on the circuit board 10 detects change (increase or decrease) of capacitivity of the trigger switch, so as to verify existence of any contact of the touch element 20 or the touch panel 30 and cause the signal output 15 to send out a signal. The signal is either sent to a microprocessor or a logic gate for making a judgment easily, or directly output to an amplifier for direct control of on/off of the switch. That is, a signal needed by a microcontroller is generated via a human-machine interface and thereby actuates a load connected to the output of the trigger switch.

Figure 4:
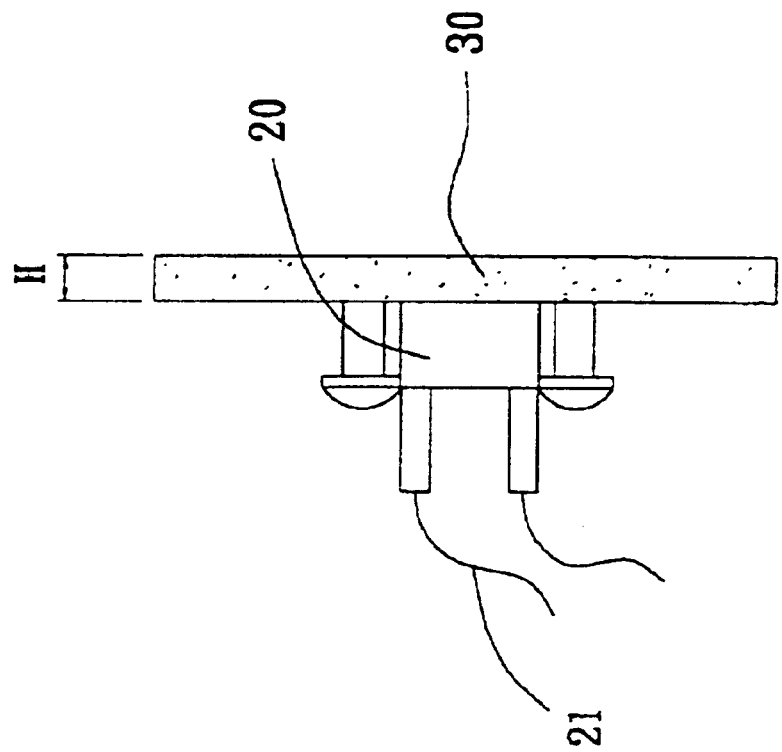
FIG. 4 is a schematic plan view of another embodiment of the present invention.

FIG. 4 is a schematic plan view of a trigger switch module according to another embodiment of the present invention. As shown, the trigger switch module also includes a switch element 20, an end of which is further provided with external connections 21. The external connections 21 may be extended to provide an additional contact end, so that the trigger switch module of the present invention may be widely applied without being limited by spatial distance and quantity. The present invention uses minimum components to achieve complete function that not only avoid the problem existing in the conventional alteration switches but also gives products with the trigger switch module of the present invention added value and profit.

With the above arrangements, the trigger switch module of the present invention may be triggered through non-direct contact of the switch to enable direct control thereof, enabling the present invention to provide functions that can be provided by conventional slide switches and push-button switches while eliminate drawbacks existing in most conventional switches. Moreover, the trigger switch module of the present invention reduces the possibility of accidents in use and ensures users' safety.

What is claimed is:

1. A trigger switch module, comprising:

a top casing;

a sensing board being located below said top casing;

a connecting element located below said sensing board; and a plurality of pins having a first end inserted into said connecting element and a second end inserted onto a circuit board located below said sensing board;

said circuit board having a control circuit, a contact end, sensors, and a signal output provided thereon; and said sensing board, said connecting element, said pins, and said circuit board all being enclosed in said top casing to form an enclosed structure; and a distance between said sensing board and said circuit board being set to produce a capacity, said capacity being changed when said top casing is touched, and said sensors on said circuit board sending out a signal via said signal output when said sensors sense any change in said capacity, and a feedback circuit being provided on said circuit board to detect any change in said body capacity to verify existence of any touch of said trigger switch module.

2. The trigger switch module as claimed in claim 1, wherein said top casing is covered at a top surface with a touch panel.

3. The trigger switch module as claimed in claim 2, wherein said sensors have sensibility that can be changed through adjustment of a sensing distance according to a thickness of said touch panel.

4. The trigger switch module as claimed in claim 1, wherein said distance between said sensing board and said circuit board is set according to body capacity.

* * * * *